(12) United States Patent
Pyo (10) Patent No.: US 8,525,161 B2
(45) Date of Patent: Sep. 3, 2013

(54) ORGANIC LIGHT EMITTING DISPLAY APPARATUS AND METHOD OF MANUFACTURING THE SAME

(75) Inventor: Sung-Chul Pyo, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 61 days.

(21) Appl. No.: 13/234,319

(22) Filed: Sep. 16, 2011

(65) Prior Publication Data

US 2012/0104396 A1  May 3, 2012

(30) Foreign Application Priority Data

Oct. 27, 2010 (KR) .................. 10-2010-0105378

(51) Int. Cl.
*H01L 35/24* (2006.01)
(52) U.S. Cl.
USPC ............... 257/40; 257/E51.001; 438/99
(58) Field of Classification Search
USPC ............ 257/40, E51.001–E51.052; 438/49; 313/504
See application file for complete search history.

(56) References Cited

U.S. PATENT DOCUMENTS

| 7,850,500 B2 * | 12/2010 | Park et al. ................. 445/24 |
| 7,893,440 B2 * | 2/2011 | Kwon et al. ................. 257/72 |
| 8,362,469 B2 * | 1/2013 | Suh ................. 257/40 |
| 2006/0022587 A1 * | 2/2006 | Jeong et al. ................. 313/504 |
| 2008/0185959 A1 * | 8/2008 | Kurauchi ................. 313/504 |
| 2010/0163854 A1 * | 7/2010 | Kho et al. ................. 257/40 |
| 2010/0255617 A1 * | 10/2010 | Choi ................. 438/23 |
| 2011/0031500 A1 * | 2/2011 | Suh ................. 257/59 |
| 2011/0140114 A1 * | 6/2011 | Ko et al. ................. 257/59 |
| 2011/0151600 A1 * | 6/2011 | Oh ................. 438/23 |

FOREIGN PATENT DOCUMENTS

| KR | 10-0579182 | 5/2006 |
| KR | 10-0784487 | 12/2007 |
| KR | 10-0793314 | 1/2008 |

\* cited by examiner

*Primary Examiner* — Matthew W Such
*Assistant Examiner* — Ali Naraghi
(74) *Attorney, Agent, or Firm* — Robert E. Bushnell, Esq.

(57) ABSTRACT

An organic light emitting display apparatus comprises an active layer, a gate electrode, a pixel electrode, source and drain electrodes, an intermediate layer, and an opposite electrode. The gate electrode includes: a first insulating layer; first, second and third conductive layers; a fourth conductive layer protecting the third conductive layer; and a fifth conductive layer. The pixel electrode includes a first electrode layer formed on the first insulating layer, a second and a third electrode layer, a fourth electrode layer protecting the third electrode layer, and a fifth electrode layer. A second insulating layer is disposed between the source and drain electrodes. The intermediate layer is disposed between the opposite electrode and the pixel electrode, and prevents damage to the pixel electrode during the manufacturing process.

21 Claims, 5 Drawing Sheets

ORGANIC LIGHT EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Oct. 27, 2010 and there duly assigned Serial No. 10-2010-0105378.

BACKGROUND OF THE INVENTION

1. Field of the Invention

The present invention relates to an organic light emitting display apparatus and a method of manufacturing the same so as to prevent damage during the manufacturing process.

2. Description of the Related Art

An organic light emitting display apparatus is manufactured by forming a thin film transistor (TFT), a capacitor, a pixel electrode and a pattern including wires connecting the TFT, the capacitor and the pixel electrode on a substrate. When the pattern is formed, an opening is formed by etching a portion of the pixel electrode by using an etching solution. In this case, the pixel electrode may include an electrode layer including metal for increasing optical efficiency, and may include another electrode layer including a transparent conductive material disposed on the electrode layer and including metal. In this case, the electrode layer including a transparent conductive material may include a plurality of pin holes in a crystalline structure.

Thus, while the opening is formed, the etching solution may penetrate into the electrode layer including metal through the pin holes so as to damage the electrode layer.

SUMMARY OF THE INVENTION

The present invention provides organic light emitting display apparatuses including a pixel electrode having a multi-layered structure for preventing the pixel electrode from being damaged during the manufacturing process, and a method of manufacturing the organic light emitting display apparatus.

According to an aspect of the present invention, an organic light emitting display apparatus comprises: an active layer formed on a substrate; a gate electrode including a first insulating layer formed on the active layer, a first conductive layer formed on the first insulating layer and comprising a transparent conductive material, a second conductive layer including metal, a third conductive layer including a transparent conductive material, a fourth conductive layer protecting the third conductive layer and including metal, and a fifth conductive layer, the first insulating layer and the first through fifth conductive layers being sequentially stacked; a pixel electrode including a first electrode layer which is formed on the first insulating layer so as to be spaced apart from the gate electrode and which includes a transparent conductive material, a second electrode layer including metal, a third electrode layer including a transparent conductive material, a fourth electrode layer for protecting the third electrode layer and including metal, and a fifth electrode layer, the first through fifth electrode layers being sequentially stacked; source and drain electrodes which are electrically connected to the active layer, a second insulating layer being disposed between the source and drain electrodes; an intermediate layer formed on the pixel electrode; and an opposite electrode facing the pixel electrode; wherein the intermediate layer is disposed between the opposite electrode and the pixel electrode.

The second electrode layer may include silver (Ag) or aluminium (Al).

The third electrode layer may include indium tin oxide (ITO) containing a pin hole.

The fourth electrode layer may include titanium (Ti).

The first electrode layer may include indium tin oxide (ITO), and the fifth electrode layer may include at least one metal selected from the group consisting of aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The first electrode layer may be formed of the same material as the first conductive layer, the second electrode layer may be formed of the same material as the second conductive layer, the third electrode layer may be formed of the same material as the third conductive layer, the fourth electrode layer may be formed of the same material as the fourth conductive layer, and the fifth electrode layer may be formed of the same material as the fifth conductive layer.

The third electrode layer of the pixel electrode may contact the intermediate layer.

The fifth electrode layer of the pixel electrode may include a first opening for exposing the fourth electrode layer formed below the fifth electrode layer, and the fourth electrode layer may include a second opening corresponding to the first opening so as to expose the third electrode layer.

The fifth electrode layer of the pixel electrode may be electrically connected to any one of the source and drain electrodes.

The second insulating layer may be formed on the gate electrode and the pixel electrode so as to insulate the gate electrode, the source electrodes and the drain electrodes from each other, and the second insulating layer may include a third opening corresponding to the first opening and the second opening.

The organic light emitting display apparatus may further include a pixel defining layer formed on the source and drain electrodes, the pixel defining layer may include a fourth opening which contacts the first opening and the second opening or which is formed in the first opening and the second opening, and the intermediate layer may contact the third electrode layer through the fourth opening.

The organic light emitting display apparatus may further include a capacitor lower electrode formed on the same layer as the active layer so as to be spaced apart from the active layer; and a capacitor upper electrode which is insulated from the capacitor lower electrode by the first insulating layer and which is formed on the same layer as the gate electrode so as to correspond to the capacitor lower electrode.

The capacitor upper electrode may include a first upper layer including ITO, a second upper layer including Ag or Al, and a third upper layer including ITO and containing a pin hole, wherein the first through third upper layers are sequentially stacked.

According to another aspect of the present invention, a method of manufacturing an organic light emitting display apparatus comprises the steps of: forming an active layer on a substrate; sequentially stacking a first insulating layer on the active layer, a first layer including indium tin oxide (ITO) on the first insulating layer, a second layer including silver (Ag) or aluminium (Al), a third layer including ITO containing a pin hole, a fourth layer protecting the third layer and including titanium (Ti), and a fifth layer, and forming a gate electrode and a pixel electrode by patterning the first layer, the second layer, the third layer, the fourth layer, and the fifth layer, wherein the pixel electrode includes a first electrode layer corresponding to the first layer, a second electrode layer corresponding to the second layer, a third electrode layer corresponding to the third layer, a fourth electrode layer corresponding to the fourth layer, and a fifth electrode layer corresponding to the fifth layer; forming a second insulating layer on the structure resulting from the sequential stacking, and patterning the second insulating layer so as to expose the pixel electrode and the active layer; forming a metal layer on the structure resulting from the formation of the second insulating layer, patterning the metal layer by using a first etching solution so as to form source and drain electrodes contacting the active layer, and simultaneously etching the fifth electrode layer of the pixel electrode by using the first etching solution to expose the fourth electrode layer; etching a portion of the fourth electrode layer of the pixel electrode, which is exposed during the formation of the metal layer, by using a second etching solution to expose the third electrode layer; and forming a pixel defining layer on the structure resulting from the etching so as to expose the third electrode layer of the pixel electrode.

The method may further include forming an intermediate layer on a portion of the third electrode layer, which is exposed during the formation of the pixel defining layer and forming an opposite electrode covering the intermediate layer.

The first etching solution may include phosphate, nitric acid and acetic acid, and the second etching solution may include a boronate acid.

Any one of the source electrode and the drain electrode may be electrically connected to the pixel electrode.

The forming of the active layer may include forming a capacitor lower electrode on the same layer as the active layer so as to be spaced apart from the active layer.

The forming of a gate electrode and a pixel electrode by patterning may include forming a capacitor upper electrode on the first insulating layer so as to correspond to the capacitor lower electrode, wherein the capacitor upper electrode includes a first upper layer including indium tin oxide (ITO), a second upper layer including silver (Ag) or aluminium (Al), a third upper layer including ITO containing a pin hole, and a fourth upper layer including titanium (Ti).

The forming of the second insulating layer may include patterning the second insulating layer so as to expose the capacitor upper electrode, and the etching of the portion of the fourth electrode layer may include etching the fourth upper layer of the capacitor upper electrode by using the second etching solution to expose the third upper layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, the present invention will be described more fully with reference to the accompanying drawings, in which exemplary embodiments of the invention are shown. This invention may, however, be embodied in many different forms and should not be construed as being limited to the exemplary embodiments set forth herein. Rather, these embodiments are provided so that this disclosure will be thorough and complete, and will fully convey the scope of the invention to those skilled in the art. In the drawings, lengths and sizes of layers and regions may be exaggerated for clarity.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section.

The terminology used herein is for the purpose of describing particular embodiments only and is not intended to limit the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Hereinafter, structures and operations of the present invention will be described with reference to embodiments of the present invention illustrated in the accompanying drawings.

Figure 1:
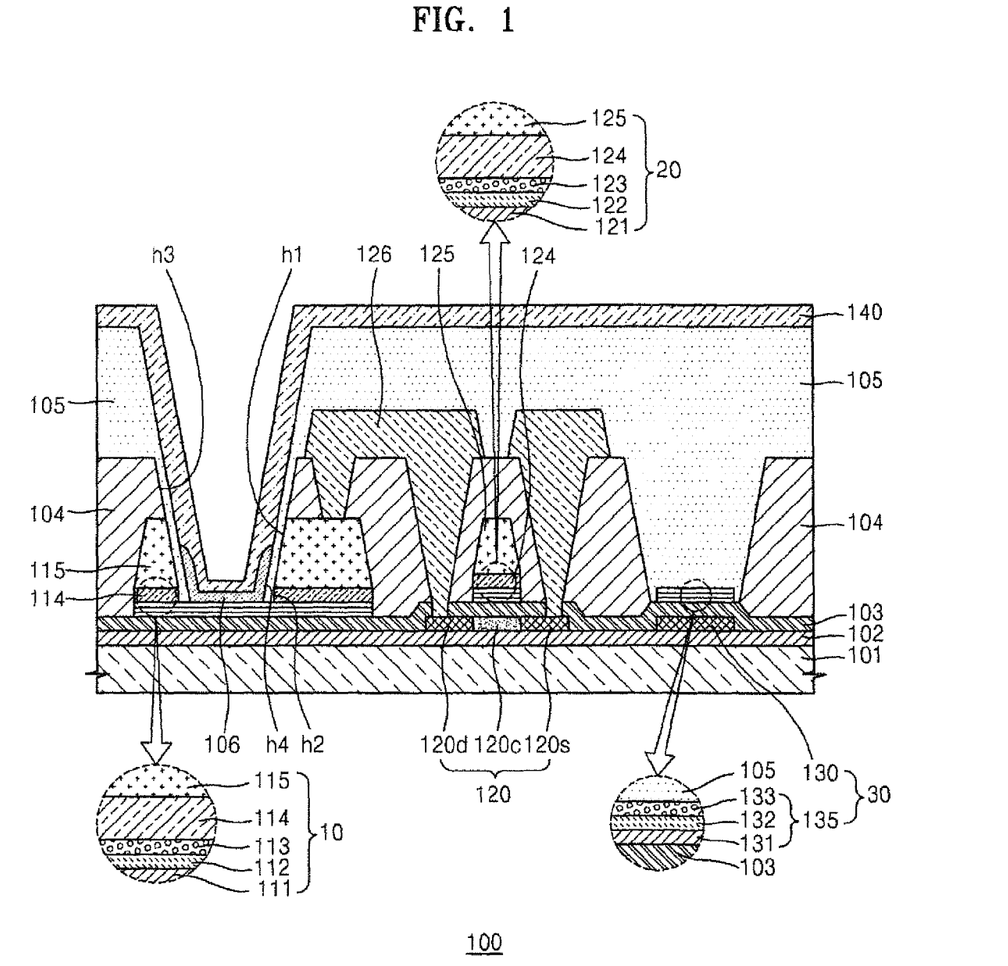
FIG. 1 is a cross-sectional view of an organic light emitting display apparatus according to an embodiment of the present invention.

FIG. 1 is a cross-sectional view of an organic light emitting display apparatus according to an embodiment of the present invention.

The organic light emitting display apparatus 100 includes a substrate 101, an active layer 120, a gate electrode 20, a pixel electrode 10, source/drain electrodes 126, a capacitor 30, an intermediate layer 106, and an opposite electrode 140.

The substrate 101 may be formed of a transparent glass material containing $SiO_2$ as a main component. However, the substrate 101 is not limited thereto, and thus it may be formed of a transparent plastic material. The plastic material used to form substrate 101 may be one organic material selected from the group consisting of, for example, polyethersulphone (PES), polyacrylate (PAR,), polyetherimide (PEI), polyethyelenen napthalate (PEN,), polyethyeleneterepthalate (PET), polyphenylene sulfide (PPS), polyallylate, polycarbonate (PC), cellulose tree acetetate (TAC), and cellulose acetate propionate (CAP).

In a bottom-emission type organic light emitting display apparatus in which an image is realized toward the substrate 101, the substrate 101 may be formed of a transparent material. In a top-emission type organic light emitting display apparatus in which an image is realized toward an opposite direction relative to the substrate 101, the substrate 101 does not have to be formed of a transparent material. In this case, the substrate 101 may be formed of metal. When the substrate 101 is formed of metal, the substrate 101 may include at least one selected from the group consisting of iron (Fe), chromium (Cr), manganese (Mn), nickel (Ni), titanium (Ti), molybdenum (Mo), stainless steel (SUS), an Invar alloy, an Inconel alloy, and a Kovar alloy, but is not limited thereto. The substrate 101 may be formed of a metal foil.

A buffer layer 102 may be formed on the substrate 101 in order to smooth the substrate 101 and to prevent the penetration of impurities. The buffer layer 102 may be formed of $SiO_2$ and/or SiNx. The buffer layer 102 may be formed by using various deposition methods, such as a plasma enhanced chemical vapor deposition (PECVD) method, an atmospheric pressure chemical vapor deposition (APCVD) method, a low pressure chemical vapor deposition (LPCVD) method, and the like.

The active layer 120 with a predetermined pattern is formed on the buffer layer 102. The active layer 120 may be formed of an inorganic semiconductor, such as an amorphous silicon (Si) or poly Si, or may be formed of an organic semiconductor, and includes a source region 120s, a drain region 120d, and a channel region 120c. The source region 120s and the drain region 120d may be formed by doping the active layer 120 formed of amorphous Si or poly Si with impurities. A p-type semiconductor may be formed by doping with a group 3 element such as boron (B), and an n-type semiconductor may be formed by doping with a group 5 element such as nitrogen (N).

A capacitor lower electrode 130 may be formed on the buffer layer 102 so as to be spaced apart from the active layer 120. That is, the active layer 120 and the capacitor lower electrode 130 are formed on the same layer. The capacitor lower electrode 130 may be formed of an inorganic semiconductor such as an amorphous Si or poly Si, or may be formed of an organic semiconductor.

A first insulating layer 103 is formed on the active layer 120 and the capacitor lower electrode 130. The first insulating layer 103 insulates the active layer 120 and the gate electrode 20 from each other, or insulates the capacitor lower electrode 130 and a capacitor upper electrode 135 from each other, and may be formed by depositing an organic material, or an inorganic material such as SiNx, and $SiO_2$ by using a PECVD method, an APCVD method, an LPCVD method, or the like.

The gate electrode 20 is formed on the first insulating layer 103. The gate electrode 20 may include first through fifth conductive layers 121, 122, 123, 124 and 125, respectively, which are sequentially stacked. In detail, the gate electrode 20 may include the first conductive layer 121 which, in turn, includes: a transparent conductive material; the second conductive layer 122 including material, the third conductive layer 123 including a transparent conductive material, the fourth conductive layer 124 protecting the third conductive layer 123 and including metal, and the fifth conductive layer 125.

The first conductive layer 121 is formed on the first insulating layer 103, and increases adhesion between the first insulating layer 103 and the second conductive layer 122. The first conductive layer 121 may include at least one material selected from the group consisting of an indium tin oxide (ITO), an indium zinc oxide (IZO), a zink oxide (ZnO), an indium oxide ($In_2O_3$), an indium galium oxide (IGO), and an aluminium zinc oxide (AZO).

The second conductive layer 122 is formed on the first conductive layer 121, and may have a single or multi-layer structure including at least one metal selected from the group consisting of aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The third conductive layer 123 is formed on the second conductive layer 122 so as to further reduce resistance of the gate electrode 20. The third conductive layer 123 may include ITO containing pin holes.

The fourth conductive layer 124 may be formed on the third conductive layer 123, and may include metal including Ti.

The fifth conductive layer 125 functions as a wire for transferring electrical signals. The fifth conductive layer 125 may have a single or multi-layer structure including at least one metal selected from the group consisting of Al, Pt, Pd, Ag, Mg, Au, Ni, Nd, Ir, Cr, Li, Ca, Mo, Ti, W, and Cu. For example, the fifth conductive layer 125 may include a first layer formed of Mo, a second layer formed on the first layer and formed of Al, and a third layer formed on the second layer and formed of Mo. When the fifth conductive layer 125 includes Mo/Al/Mo, Al functions as a wire or an electrode, and Mo functions as a barrier layer.

The pixel electrode 10 is formed on the same layer as the gate electrode 20, that is, on the first insulating layer 103 so as to be spaced apart from the gate electrode 20. The pixel electrode 10 may be formed of the same material, and may have the same structure, as the gate electrode 20. The pixel electrode 10 may be formed on the first insulating layer 103, and may include a first electrode layer 111 including a transparent conductive material, a second electrode layer 112 including metal, a third electrode layer 113 including a transparent conductive material, and a fourth electrode layer 114 protecting the third electrode layer 113 and including metal, and a fifth electrode layer 115, all of which are sequentially stacked.

The first electrode layer 111 may include at least one material selected from the group consisting of ITO, IZO, ZnO, $In_2O_3$, IGO and AZO, like the first conductive layer 121. The first electrode layer 111 strengthens adhesion between the second electrode layer 112 including metal and the first insulating layer 103 including an insulating material. Thus, penetration of etching solutions and moisture may be prevented during patterning processes, and thus highly reliable devices may be manufactured.

The second electrode layer 112 may have a single or multi-layer structure including at least one metal selected from the group consisting of Al, Pt, Pd, Ag, Mg, Au, Ni, Nd, Ir, Cr, Li, Ca, Mo, Ti, W, and Cu, like the second conductive layer 122. The second electrode layer 112 may function as a metal mirror for partially transmitting or reflecting light. That is, the second electrode layer 112 may be used as a half-mirror of an organic light emitting display apparatus employing an optical resonator.

The third electrode layer 113 may include ITO containing pin holes, like the third conductive layer 123. For example, when the third electrode layer 113 is formed of ITO, heat treatment may be performed. In this case, as the ITO is crystallized, the sizes and number of the pin holes of the ITO may be increased. An etchant may penetrate into the second electrode layer 112 through the pin holes so as to damage the second electrode layer 112. The third electrode layer 113 is stacked on the second electrode layer 112 so as to further reduce resistance of the pixel electrode 10.

The fourth electrode layer 114 may include metal including Ti, like the fourth conductive layer 124. The fourth electrode layer 114 prevents a first etching solution from penetrating into the pin holes of the third electrode layer 113 so as to corrode the second electrode layer 112 while a first opening h1 is formed by etching the fifth electrode layer 115. The thickness of the fourth electrode layer 114 may range from about 10 Å to about 10000 Å. When the thickness of the fourth electrode layer 114 is smaller than about 10 Å, the fourth electrode layer 114 may not function as a protective layer. When the thickness of the fourth electrode layer 114 is greater than about 1000 Å, process efficiency may be remarkably reduced. According to an embodiment of the present invention, the fourth electrode layer 114 includes a second opening h2 corresponding to the first opening h1 so as expose the third electrode layer 113 by using a second etching solution which is different from the first etching solution.

The fifth electrode layer 115 may have a single-layer or multi-layer structure including at least one metal selected from the group consisting of Al, Pt, Pd, Ag, Mg, Au, Ni, Nd, Ir, Cr, Li, Ca, Mo, Ti, W, and Cu, like the fifth conductive layer 125. According to the present embodiment, the fifth electrode layer 115 may include the first opening h1 so as to expose the fourth electrode layer 114 formed below the fifth electrode layer 115 by using the first etching solution. The fifth electrode layer 115 may be electrically connected to any one of the source and drain electrodes so as to transfer electrical signals.

The capacitor upper electrode 135 may be formed on the first insulating layer 103 so as to correspond to the capacitor lower electrode 130. The capacitor upper electrode 135 may be formed on the same layer as the gate electrode 20 and the pixel electrode 10. The capacitor upper electrode 135 may be formed of the same material and may have the same structure as portions of the gate electrode 20 and the pixel electrode 10. The capacitor upper electrode 135 may be formed by sequentially forming a first upper layer 131 on the first insulating layer 103 and including a transparent conductive material, a second upper layer 132 including metal, and a third upper layer 133 including a transparent conductive material.

The first upper layer 131 corresponds to the first electrode layer 111 of the pixel electrode 10, the second upper layer 132 corresponds to the second electrode layer 112 of the pixel electrode 10, and the third upper layer 133 corresponds to the third electrode layer 113 of the pixel electrode 10. For example, the first upper layer 131 may include ITO, the second upper layer 132 may include Ag or Al, and the third upper layer 133 may include ITO containing a pin hole. Materials and properties of the first thru third upper layers 131, 132 and 133, respectively, have been described already when describing the pixel electrode 10, and thus will not be repeated.

The capacitor 30 includes the capacitor lower electrode 130 and the capacitor upper electrode 135, wherein the first insulating layer 103 is formed between the capacitor lower electrode 130 and the capacitor upper electrode 135. In this case, since the capacitor lower electrode 130 is formed on the same layer as the active layer 120, and the capacitor upper electrode 135 is formed on the same layer as the gate electrode 20, the thickness of the organic light emitting display apparatus 100 may be effectively reduced.

A second insulating layer 104 is formed on the gate electrode 20, the pixel electrode 10 and the capacitor upper electrode 135. The second insulating layer 104 may smooth an upper surface of a thin film transistor (TFT) region containing the gate electrode 20, an upper surface of a region containing the pixel electrode 10, and an upper surface of a region containing the capacitor 30, and insulates the gate electrode 20 and the source/drain electrodes 126 from each other. The second insulating layer 104 may be formed of various insulating materials. For example, the second insulating layer 104 may includes an inorganic material, such as an oxide or a nitride, or an organic material. Examples of an inorganic insulation layer for forming the second insulating layer 104 may include $SiO_2$, SiNx, SiON, $Al_2O_3$, $TiO_2$, $Ta_2O_5$, $HfO_2$, $ZrO_2$, BST ($Ba_xSr_yTiO_3$), and PZT ($Pb_xZr_yTiO_3$). Examples of an organic insulation layer for forming the second insulating layer 104 may include a general-use polymer (PMMA, PS), a polymer derivative having a phenol group, an acrylic polymer, an imide-based polymer, an aryl ether-based polymer, an amide-based polymer, a fluorine polymer, a p-xylene-based polymer, a vinyl alcohol-based polymer, and a blend of these. The second insulating layer 104 may be formed of a composite stack of an organic insulation layer and an organic insulation layer. The second insulating layer 104 may be formed by using a spin coating method.

The second insulating layer 104 includes a third opening h3 corresponding to the first opening h1 and the second opening h2. The first opening h1 and the second opening h2 may be exposed through the third opening h3. The second insulating layer 104 may include a contact hole for exposing the source/drain regions 120s and 120d, respectively, of the active layer 120.

The source/drain electrodes 126 are formed so as to contact the source/drain regions 120s and 120d, respectively, of the active layer 120 through the contact hole. In this case, any one of the source/drain electrodes 126 is connected to the pixel electrode 10. In detail, any one of the source/drain electrodes 126 is electrically connected to the fifth electrode layer 115 of the pixel electrode 10.

The source/drain electrodes 126 may be formed by patterning a metal layer. The metal layer may have a multi-layered film structure. For example, the source/drain electrodes 126 may have a single or multi-layer structure including at least one metal selected from the group consisting of Al, Pt, Pd, Ag, Mg, Au, Ni, Nd, Ir, Cr, Li, Ca, Mo, Ti, W, and Cu.

A pixel defining layer 105 is formed on the source/drain electrodes 126. The pixel defining layer 105 may be formed of an organic or inorganic material. The pixel defining layer 105 may include a fourth opening h4. The fourth opening h4 may contact the first opening h1 and the second opening h2 so as to correspond to the third opening h3, or may be formed in the first opening h1 and the second opening h2. The third electrode layer 113 of the pixel electrode 10 is exposed through the fourth opening h4.

The intermediate layer 106 may be formed so as to contact the third electrode layer 113 of the pixel electrode 10 through the fourth opening h4. The intermediate layer 106 emits light by electrically driving the pixel electrode 10 and the opposite electrode 140. An emission layer included in the intermediate layer 106 may include a low molecular weight organic material or a high molecular weight organic material. When the emission layer includes a low molecular weight organic material, the intermediate layer 106 may include at least one selected from the group consisting of a hole injection layer (HIL), a hole transport layer (HTL), an organic emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like. When the emission layer includes a high molecular weight organic material, the intermediate layer 106 may include the HTL in addition to the emission layer. The HTL may be formed of poly-(2,4)-ethylene-dihydroxy thiophene (PEDOT), polyaniline (PANI), or the like. In this case, examples of available organic materials may be formed of polyphenylenevinylenes (PPVs) or polyfluorenes. The intermediate layer 106 may be formed on the pixel electrode 10 by inkjet printing, spin coating, or the like.

The opposite electrode 140 is formed on the intermediate layer 106. The opposite electrode 140 faces the pixel electrode 10, and the intermediate layer 106 is disposed between the opposite electrode 140 and the pixel electrode 10. The opposite electrode 140 may be formed by depositing a metal having a low work function, such as Ag, Mg, Al, Pt, Pd, Au, Ni, Nd, Ir, Cr, Li, Ca or a compound thereof, and then depositing a transparent conductive material, such as ITO, IZO, ZnO, or $In_2O_3$, on the metal.

An encapsulating substrate (not shown) may be disposed on the opposite electrode 140. The encapsulating substrate protects the intermediate layer 106 and other layers from external moisture or oxygen, and is formed of a transparent material. To this end, the encapsulating substrate comprises a multi-layered structure including an organic material and an inorganic material formed on glass substrate or plastic substrate.

FIGS. 2 thru 9 are cross-sectional views of a method of manufacturing the organic light emitting display apparatus of FIG. 1 according to an embodiment of the present invention. The method according to the present embodiment will now be described with reference to FIGS. 2 thru 9.

Figure 2:
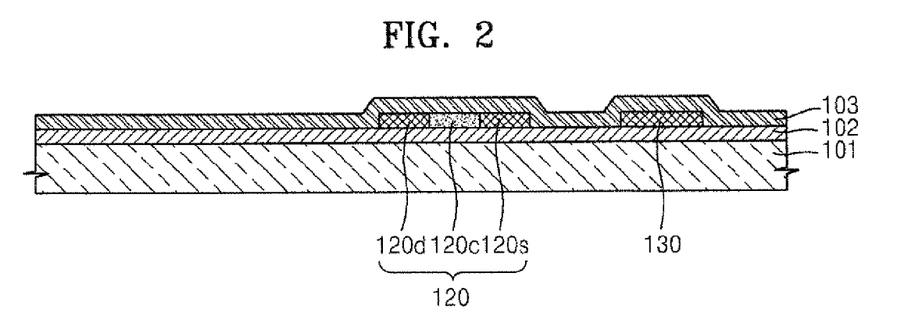
FIGS. 2 thru 9 are cross-sectional views describing a method of manufacturing the organic light emitting display apparatus of FIG. 1 according to an embodiment of the present invention.

Referring to FIG. 2, the substrate 101 is prepared, and the buffer layer 102 is formed so as to smooth the substrate 101 and to prevent penetration of moisture and impurities. The active layer 120 is formed on the buffer layer 102, and the capacitor lower electrode 130 is formed so as to be spaced apart from the active layer 120 on the same layer as the active layer 120. The active layer 120 and the capacitor lower electrode 130 are simultaneously formed by photolithography using a single mask.

Figure 3:
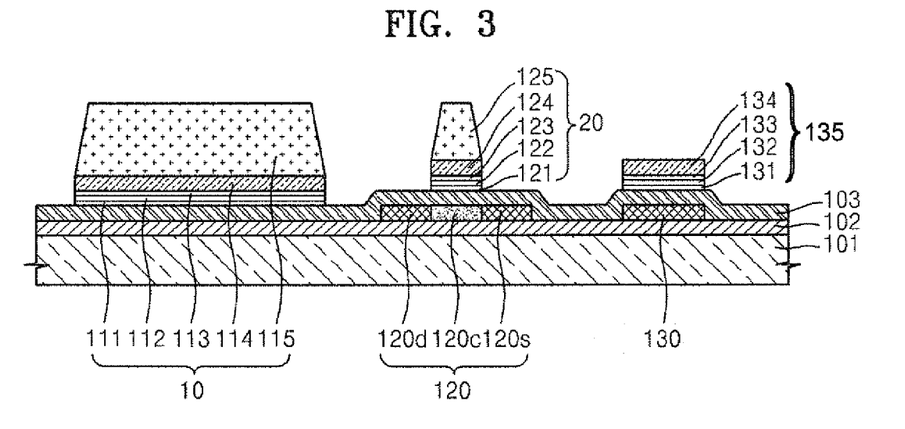

Referring to FIG. 3, the first insulating layer 103 is formed on the active layer 120 and the capacitor lower electrode 130. The gate electrode 20, the pixel electrode 10 and the capacitor upper electrode 135 are formed on the first insulating layer 103. In detail, a first layer including ITO, a second layer including Ag or Al, a third layer including ITO containing a pin hole, a fourth layer protecting the third layer and including TI, and a fifth layer are sequentially formed on the first insulating layer 103. Then, the first layer, the second layer, the third layer, the fourth layer and the fifth layer are patterned to form the gate electrode 20 and the pixel electrode 10. The gate electrode 20 is formed so as to correspond to the active layer 120, and the pixel electrode 10 is formed so as to be spaced apart from the gate electrode 20. Thus, the gate electrode 20 includes the first through fifth conductive layers 121, 122, 123, 124, and 125, as described with reference to FIG. 1. In addition, the pixel electrode 10 includes the first electrode layer 111 corresponding to the first layer, the second electrode layer 112 corresponding to the second layer, the third electrode layer 113 corresponding to the third layer, the fourth electrode layer 114 corresponding to the fourth layer, and the fifth electrode layer 115 corresponding to the fifth layer, as described with reference to FIG. 1. Thus, the gate electrode 20 may be formed on the same layer, may be formed of the same material, and may have the same structure as the pixel electrode 10.

The capacitor upper electrode 135 is formed on the same layer as the gate electrode 20 so as to correspond to the capacitor lower electrode 130. The capacitor upper electrode 135 may be patterned so as to include the first upper layer 131 corresponding to the first layer, the second upper layer 132 corresponding to the second layer, the third upper layer 133 corresponding to the third layer, and a fourth upper layer 134 corresponding to the fourth layer. However, the present embodiment is not limited to this structure. That is, the capacitor upper electrode 135 may include four layers formed by forming five layers including patterned first through fifth layers and then etching an uppermost layer. The gate electrode 20, the pixel electrode 10 and the capacitor upper electrode 135 may be formed by stacking the same material and then performing photolithography on the material using a single mask.

Figure 4:
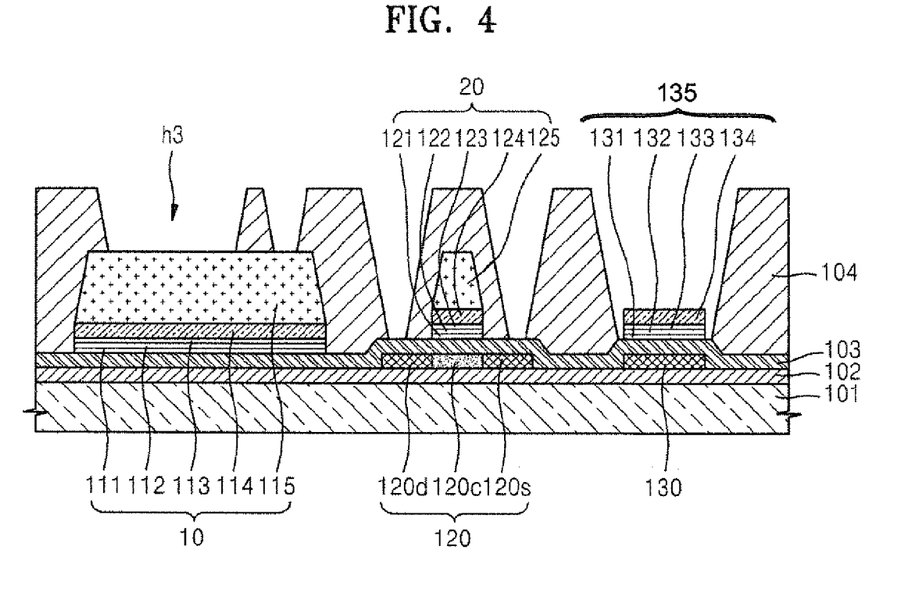

Referring to FIG. 4, the second insulating layer 104, which is a kind of a planarization layer, is formed so as to cover the pixel electrode 10 and the capacitor upper electrode 135. In addition, a contact hole is formed in the second insulating layer 104. The source/drain regions 120s and 120d, respectively, of the active layer 120 are exposed through the contact hole formed in the second insulating layer 104. In order to form the contact hole, photolithography may be used. In addition, a third opening h3 is formed in the second insulating layer 104. The fifth electrode layer 115 of the pixel electrode 10 is exposed through the third opening h3. In addition, a hole for exposing a fifth electrode layer 114 of the pixel electrode 10 is formed in the second insulating layer 104 so as to connect the source/drain electrodes 126 and the pixel electrode 10 to each other. An opening for exposing the capacitor upper electrode 135 is formed in the second insulating layer 104.

Figure 5:
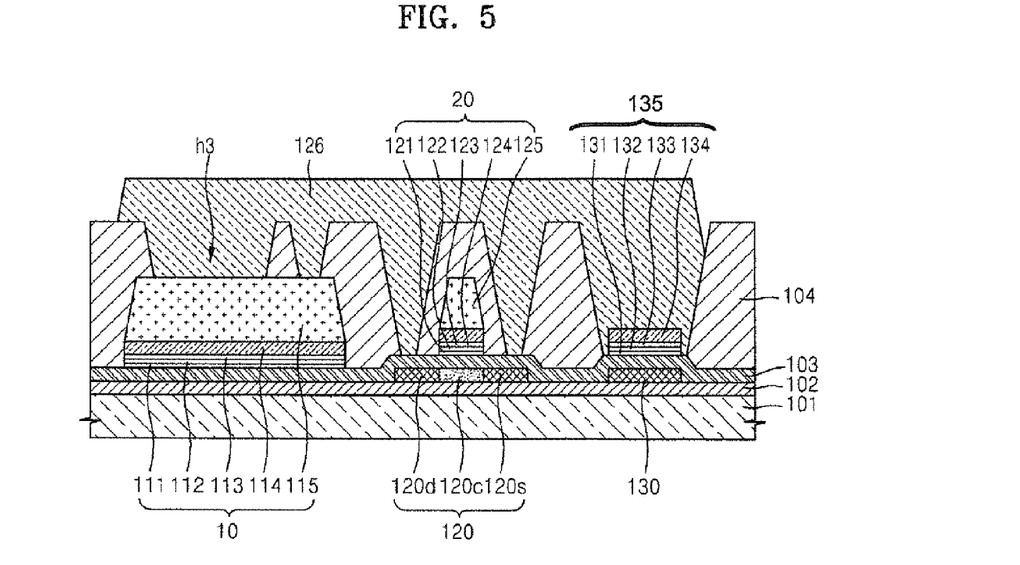

Referring to FIG. 5, a metal layer is formed on the second insulating layer 104 in which the opening and the contact hole are formed.

Figure 6:
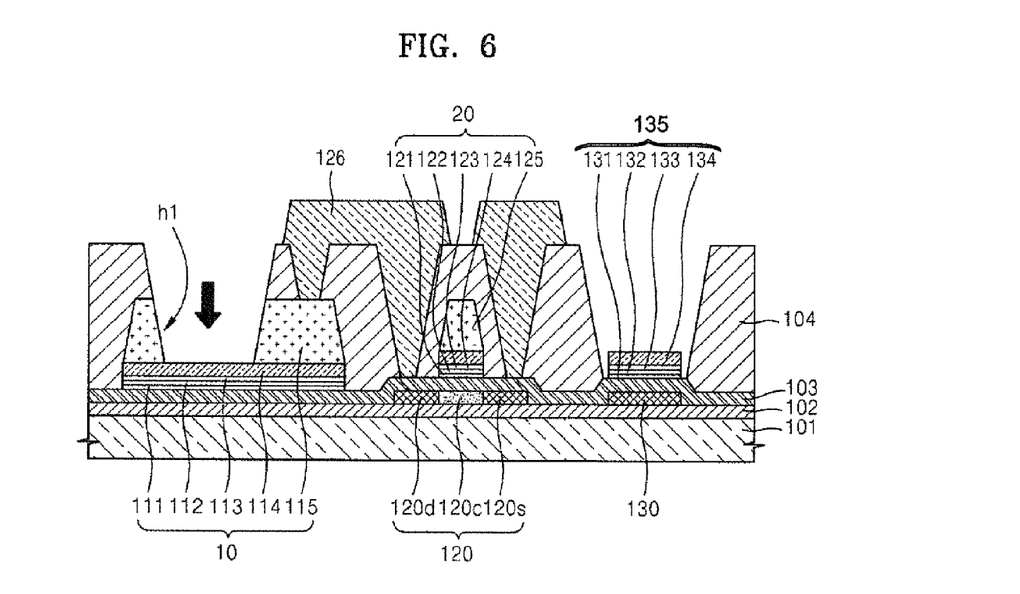

Referring to FIG. 6, the metal layer is patterned by a first etching solution to form the source/drain electrodes 126. The source/drain electrodes 126 contact the source/drain regions 120s and 120d of the active layer 120. In addition, any one of the source/drain electrodes 126 contacts the pixel electrode 10, that is, the fifth electrode layer 115. The source/drain electrodes 126 may be formed using various conductive layers, and may have a multi-layered structure.

When the source/drain electrodes 126 are formed, the first opening h1 for exposing the fourth electrode layer 114 is simultaneously formed by etching the fifth electrode layer 115 of the pixel electrode 10 by using the first etching solution. The third electrode layer 113 of the pixel electrode 10 includes a pin hole which is generated while ITO is crystallized when the ITO is heat-treated. Without the fourth electrode layer 114 during a process of etching the fifth electrode layer 115 of the pixel electrode 10, the first etching solution may penetrate into the pin hole of the third electrode layer 113 so as to damage the second electrode layer 112. When the second electrode layer 112 is damaged, it is difficult to perform a function of transmitting and reflecting light, and thus an optical resonator may not be embodied. However, due to the fourth electrode layer 114, the second electrode layer 112 is not damaged through an etching solution for etching the fifth electrode layer 115.

In this case, when the fifth electrode layer 115 has a multi-layered structure including a first layer formed of Mo, a second layer formed on the first layer and formed of Al, and a third layer formed on the second layer and formed of Mo, the first etching unit may be a mixed acid including phosphate, nitric acid and acetic acid. In this case, the first etching solution selectively etches metal and, specifically, does not etch the fourth electrode layer 114 including Ti.

Figure 7:
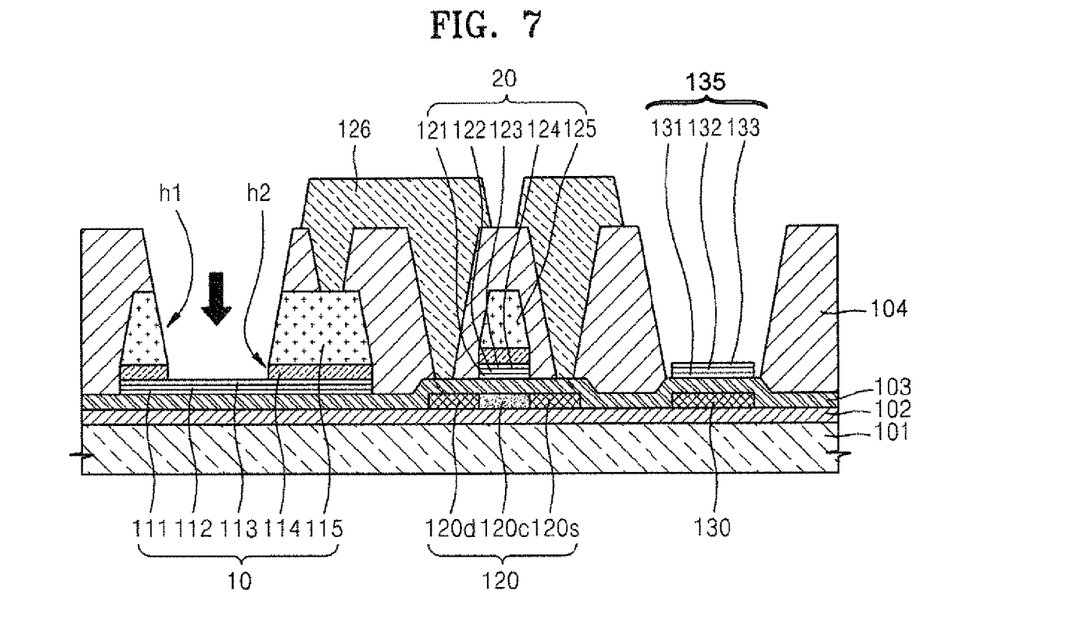

Referring to FIG. 7, the second opening h2 for exposing the third electrode layer 113 is formed by etching an exposed portion of the fourth electrode layer 114 of the exposed pixel electrode 10. In this case, the fourth electrode layer 114 is etched by a second etching solution. The second etching solution may include a boronate acid. For example, the second etching solution may include HF of 0.1 wt % to 5 wt %, and a solvent. The second etching solution etches the fourth electrode layer 114 including Ti, but does not affect the source/drain electrodes 126, the third electrode layer 113, and the second electrode layer 112. As an experimental result, when a multi-layered structure including ITO/Ag/ITO reacts with a solution including HF of about 0.5 wt % and a solvent, ITO and Ag are not damaged.

The fourth electrode layer 114 of the pixel electrode 10 protects the second electrode layer 112 from the first etching solution, and needs to be removed in the final product. If the fourth electrode layer 114 is not removed, since brightness is remarkably changed according to current density, the fourth electrode layer 114 needs to be removed in order to maintain the brightness of the organic light emitting display apparatus 100. In addition, when the fourth electrode layer 114 is removed, a current density is gradually changed according to an applied voltage. Thus, when the fourth electrode layer 114 is removed, high brightness may be provided by applying a low voltage, compared to a case where the fourth electrode layer 114 is not removed.

According to the present embodiment, by using two etching solutions, the second electrode layer 112 and the third electrode layer 113 are effectively protected, and an organic light emitting display apparatus 100 having good luminous efficiency may be embodied without using any separate mask.

In addition, the second etching solution may etch the fourth electrode layer 114, and simultaneously may etch an exposed portion of the fourth upper layer 134 of the capacitor upper electrode 135. This is because the fourth upper layer 134 of the capacitor upper electrode 135 is formed of the same material as the fourth electrode layer 114 of the pixel electrode 10. However, the present embodiment is not limited to this structure. That is, the fourth upper layer 134 of the capacitor upper electrode 135 may remain instead of being etched.

Figure 8:
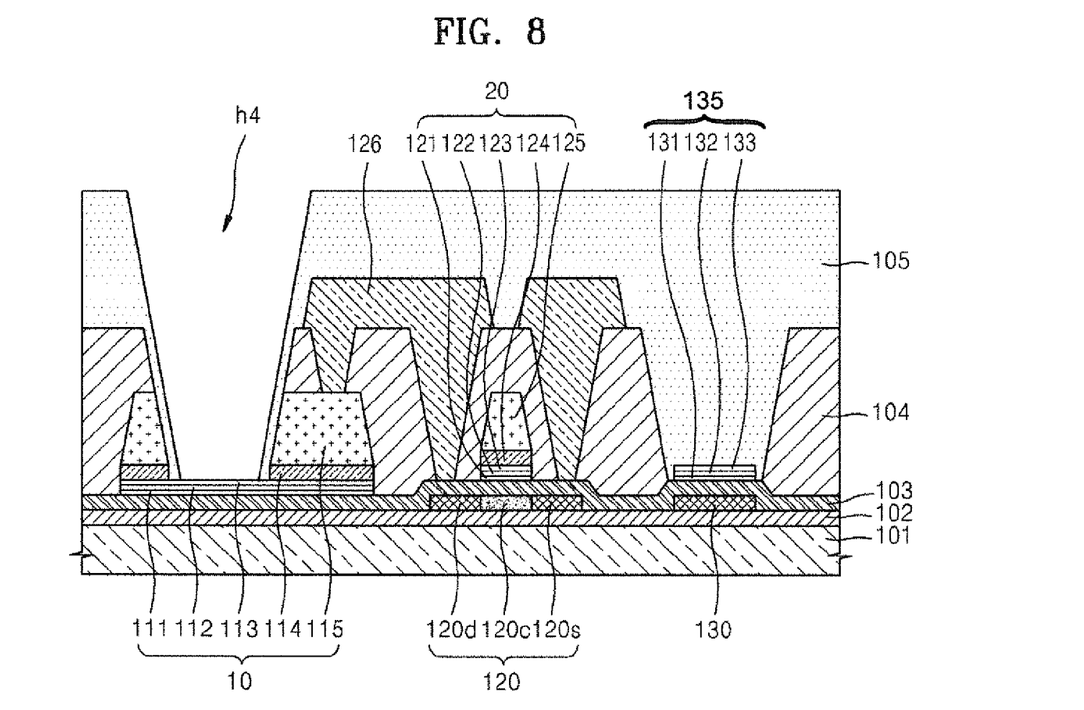

Referring to FIG. 8, the pixel defining layer 105 is formed on the source/drain electrodes 126. The pixel defining layer 105 may be formed of an organic material. The fourth opening h4 is formed in the pixel defining layer 105 so as to expose the third electrode layer 113 of the pixel electrode 10. The fourth opening h4 may contact a first opening h1 and the second opening h2 (FIG. 7), or it may be disposed in the first opening h1 and the second opening h2.

Figure 9:
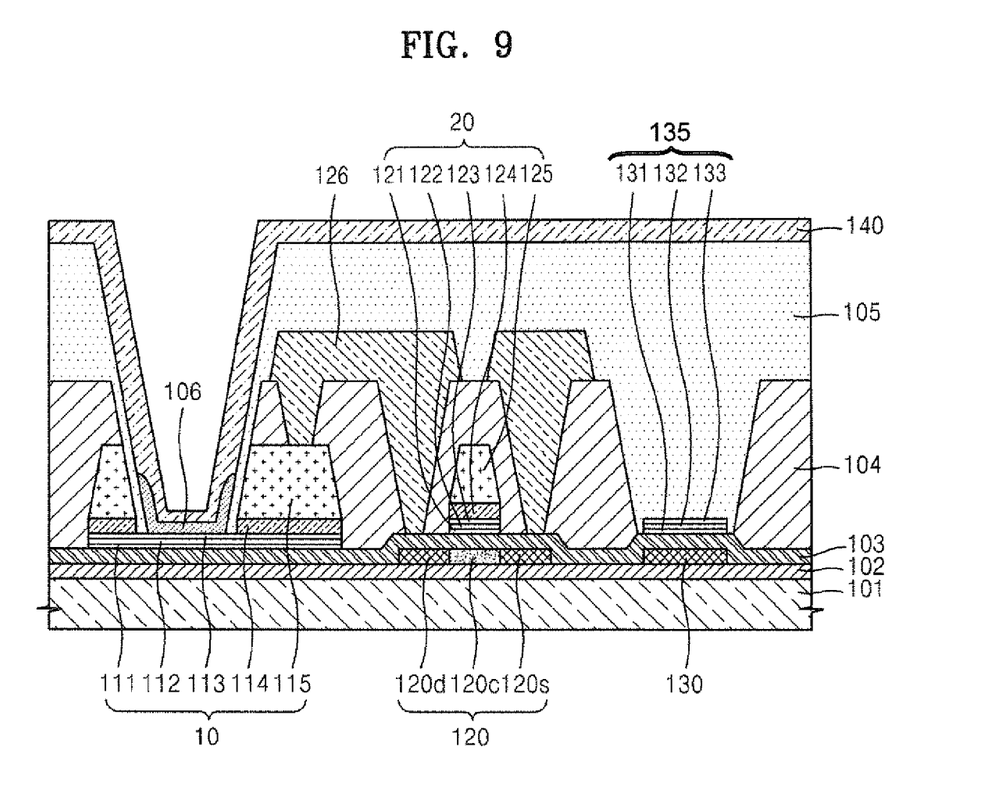

Referring to FIG. 9, the intermediate layer 106 and the opposite electrode 140 are sequentially formed on a portion of the third electrode layer 113 of the pixel electrode 10, which is exposed through the fourth opening h4 (FIG. 8) of the pixel defining layer 105. The intermediate layer 106 includes an emission layer. Materials used to form the intermediate layer 106 and the opposite electrode 140 are the same as materials used in the above-described embodiments, and thus will be omitted.

Although not illustrated, an encapsulating substrate (not shown) may be disposed on the opposite electrode 140 so as to face a surface of the substrate 101. The encapsulating substrate protects the intermediate layer 106 and other layers from external moisture or oxygen, and is formed of a transparent material. In this end, the encapsulating substrate comprises a multi-layered structure including an organic material and an inorganic material formed on a glass substrate or a plastic substrate.

According to an embodiment of the present invention, the gate electrode 20 may be formed on the same layer as, and may be formed of the same material as, the pixel electrode 10. Thus, the number of used masks is reduced, and manufacturing processes may be simplified. In addition, the manufacturing processes may also be simplified by simultaneously forming the capacitor lower electrode 130 on the same layer as the active layer 120, and by simultaneously forming the capacitor upper electrode 135 on the same layer as the gate electrode 20.

According to an embodiment of the present invention, the pixel electrode 10 may have a multi-layered structure, and specifically, may include the second electrode layer 112 functioning as a metal mirror which partially transmits or reflects light, and the fourth electrode layer 114 for protecting the second electrode layer 112 from an etching solution during etching processes. Thus, an organic light emitting display apparatus including the pixel electrode 10 may employ an optical resonator.

In FIGS. 1 thru 9, a single TFT and a single capacitor are illustrated, but this is for convenience of description, and one or more embodiments of the present invention are not limited to FIGS. 1 thru 9. Thus, an organic light emitting display apparatus may include a plurality of TFTs and a plurality of capacitors as long as the number of mask processes is not increased.

As described above, according to one or more embodiments of the present invention, a pixel electrode has a multi-layered structure including a fourth electrode which includes Ti, and thus the pixel electrode may prevent an etching solution from penetrating into a second electrode layer through a pin hole of a third electrode layer so as to damage a second electrode layer including Ag or Al.

Moreover, the pixel electrode includes the second electrode layer including Ag or Al, and thus an organic light emitting display apparatus may employ an optical resonator.

In addition, since the organic light emitting display apparatus may be manufactured using a small number of masks, manufacturing cost may be reduced due to the reduced number of masks, and the manufacturing process may be simplified.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light emitting display apparatus, comprising:
    an active layer formed on a substrate;
    a gate electrode comprising a first insulating layer formed on the active layer, a first conductive layer formed on the first insulating layer and comprising a transparent conductive material, a second conductive layer comprising metal, a third conductive layer comprising a transparent conductive material, a fourth conductive layer protecting the third conductive layer and comprising metal, and a fifth conductive layer, wherein the first insulating layer and the first thru fifth conductive layers are sequentially stacked on the active layer;
    a pixel electrode comprising a first electrode layer formed on the first insulating layer so as to be spaced apart from the gate electrode and comprising a transparent conductive material, a second electrode layer comprising metal, a third electrode layer comprising a transparent conductive material, a fourth electrode layer protecting the third electrode layer and comprising metal, and a fifth electrode layer, wherein the first thru fifth electrode layers are sequentially stacked;
    source and drain electrodes electrically connected to the active layer, wherein a second insulating layer is disposed between the source and drain electrodes;
    an intermediate layer formed on the pixel electrode; and
    an opposite electrode facing the pixel electrode, wherein the intermediate layer is disposed between the opposite electrode and the pixel electrode.

2. The organic light emitting display apparatus of claim 1, wherein the second electrode layer comprises one of silver (Ag) and aluminum (Al).

3. The organic light emitting display apparatus of claim 1, wherein the third electrode layer comprises indium tin oxide (ITO) containing a pin hole.

4. The organic light emitting display apparatus of claim 1, wherein the fourth electrode layer comprises titanium (Ti).

5. The organic light emitting display apparatus of claim 1, wherein the first electrode layer comprises indium tin oxide (ITO), and wherein the fifth electrode layer comprises at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

6. The organic light emitting display apparatus of claim 1, wherein the first electrode layer is formed of a same material as the first conductive layer;
 wherein the second electrode layer is formed of a same material as the second conductive layer;
 wherein the third electrode layer is formed of a same material as the third conductive layer;
 wherein the fourth electrode layer is formed of a same material as the fourth conductive layer; and
 wherein the fifth electrode layer is formed of a same material as the fifth conductive layer.

7. The organic light emitting display apparatus of claim 1, wherein the third electrode layer of the pixel electrode contacts the intermediate layer.

8. The organic light emitting display apparatus of claim 1, wherein the fifth electrode layer of the pixel electrode comprises a first opening for exposing the fourth electrode layer formed below the fifth electrode layer, and wherein the fourth electrode layer comprises a second opening corresponding to the first opening for exposing the third electrode layer.

9. The organic light emitting display apparatus of claim 8, wherein the second insulating layer is formed on the gate electrode and the pixel electrode so as to insulate the gate electrode from the source and drain electrodes, and wherein the second insulating layer comprises a third opening corresponding to the first opening and the second opening.

10. The organic light emitting display apparatus of claim 9, further comprising a pixel defining layer formed on the source and drain electrodes;
 wherein the pixel defining layer comprises a fourth opening which contacts the first opening and the second opening; and
 wherein the intermediate layer contacts the third electrode layer through the fourth opening.

11. The organic light emitting display apparatus of claim 9, further comprising a pixel defining layer formed on the source and drain electrodes;
 wherein the pixel defining layer comprises a fourth opening which is formed in the first opening and the second opening; and
 wherein the intermediate layer is formed in the third electrode layer through the fourth opening.

12. The organic light emitting display apparatus of claim 1, wherein the fifth electrode layer of the pixel electrode is electrically connected to one of the source electrode and the drain electrode.

13. The organic light emitting display apparatus of claim 1, further comprising:
 a capacitor lower electrode formed on a same layer as the active layer and spaced apart from the active layer; and
 a capacitor upper electrode insulated from the capacitor lower electrode by the first insulating layer and formed on a same layer as the gate electrode so as to correspond to the capacitor lower electrode.

14. The organic light emitting display apparatus of claim 13, wherein the capacitor upper electrode comprises a first upper layer comprising indium tin oxide (ITO), a second upper layer comprising one of silver (Ag) and aluminum (Al), and a third upper layer comprising ITO containing a pin hole, wherein the first thru third upper layers are sequentially stacked.

15. A method of manufacturing an organic light emitting display apparatus, the method comprising the steps of:
 forming an active layer on a substrate;
 sequentially stacking a first insulating layer on the active layer, a first layer comprising indium tin oxide (ITO) on the first insulating layer, a second layer comprising one of silver (Ag) and aluminum (Al), a third layer comprising ITO containing a pin hole, a fourth layer for protecting the third layer and comprising titanium (Ti), and a fifth layer;
 forming a gate electrode and a pixel electrode by patterning the first layer, the second layer, the third layer, the fourth layer, and the fifth layer, wherein the pixel electrode comprises a first electrode layer corresponding to the first layer, a second electrode layer corresponding to the second layer, a third electrode layer corresponding to the third layer, a fourth electrode layer corresponding to the fourth layer, and a fifth electrode layer corresponding to the fifth layer;
 forming a second insulating layer on a structure resulting from sequential stacking, and patterning the second insulating layer so as to expose the pixel electrode and the active layer;
 forming a metal layer on a structure resulting from the forming of the second insulating layer, patterning the metal layer by using a first etching solution so as to form source and drain electrodes contacting the active layer, and simultaneously etching the fifth electrode layer of the pixel electrode by using the first etching solution to expose the fourth electrode layer;
 etching a portion of the fourth electrode layer of the pixel electrode, which is exposed during the forming of the metal layer, by using a second etching solution to expose the third electrode layer; and
 forming a pixel defining layer on a structure resulting from etching so as to expose the third electrode layer of the pixel electrode.

16. The method of claim 15, further comprising the steps of forming an intermediate layer on a portion of the third electrode layer, which is exposed during the forming of the pixel defining layer, and forming an opposite electrode covering the intermediate layer.

17. The method of claim 15, wherein the first etching solution comprises phosphate, nitric and acetic acids, and wherein the second etching solution comprises a boronate acid.

18. The method of claim 15, wherein one of the source electrode and the drain electrode is electrically connected to the pixel electrode.

19. The method of claim 15, wherein the step of forming the active layer comprises forming a capacitor lower electrode on a same layer as the active layer and spaced apart from the active layer.

20. The method of claim 19, wherein the step of forming the gate electrode and the pixel electrode by patterning comprises forming a capacitor upper electrode on the first insulating layer so as to correspond to the capacitor lower electrode, wherein the capacitor upper electrode comprises a first upper layer comprising indium tin oxide (ITO), a second upper layer comprising one of silver (Ag) and aluminum (Al), a third upper layer comprising ITO containing a pin hole, and a fourth upper layer comprising titanium (Ti).

21. The method of claim 20, wherein the step of forming the second insulating layer comprises patterning the second insulating layer so as to expose the capacitor upper electrode, and wherein the step of etching the portion of the fourth electrode layer comprises etching the fourth upper layer of the capacitor upper electrode by using the second etching solution to expose the third upper layer.

* * * * *